United States Patent
Watanabe

(10) Patent No.: US 6,819,608 B2
(45) Date of Patent: Nov. 16, 2004

(54) METHOD OF RECOVERING MEMORY MODULE, MEMORY MODULE AND VOLATILE MEMORY

(75) Inventor: Takayuki Watanabe, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/620,504

(22) Filed: Jul. 16, 2003

(65) Prior Publication Data

US 2004/0062086 A1 Apr. 1, 2004

(30) Foreign Application Priority Data

Jul. 24, 2002 (JP) ........................................ 2002-215206

(51) Int. Cl.⁷ ............................................... G11C 7/00
(52) U.S. Cl. .................... 365/200; 365/201; 365/185.08
(58) Field of Search ................................ 365/200, 201, 365/185.08, 51

(56) References Cited

U.S. PATENT DOCUMENTS 5,123,016 A  * 6/1992 Muller et al. ............... 365/200
6,035,432 A  * 3/2000 Jeddeloh ..................... 714/763

FOREIGN PATENT DOCUMENTS

| JP | 03-041538 | 2/1991 | ............ G06F/12/16 |
| JP | 09-091991 | 4/1997 | ............ G11C/29/00 |
| JP | 11-017098 | 1/1999 | ............ H01L/25/00 |
| JP | 2000-030487 | 1/2000 | ............ G11C/29/00 |
| JP | 2000-149588 | 5/2000 | ............ G11C/29/00 |

* cited by examiner

Primary Examiner—Huan Hoang
(74) Attorney, Agent, or Firm—Hayes Soloway P.C.

(57) ABSTRACT

A memory module recovery method involves previously storing a defective row address and a defective column address corresponding to a memory cell in a volatile memory determined as defective, and defective device information for discriminating the volatile memory determined as defective in a non-volatile memory, transferring the defective row address, defective column address and defective device information stored in the non-volatile memory to a volatile memory upon start-up of a system for holding the information in the volatile memory, and accessing a redundant memory cell instead of the memory cell determined as defective when receiving an address corresponding to the memory cell determined as defective, based on the defective row address, defective column address and defective device information held in the volatile memory.

6 Claims, 14 Drawing Sheets

| An .... Am+3 Am+2 Am+1 | Am Am-1 ---- A0 | |
|---|---|---|
| 0 ..... 0 0 1 | | DEFECT RECOVERY NUMBER / MODULE BANK INFORMATION |
| 0 ..... 0 1 1 | | DEFECTIVE ROW ADDRESS |
| 0 ..... 1 0 1 | | DEFECTIVE COLUMN ADDRESS |

*FIG. 11*

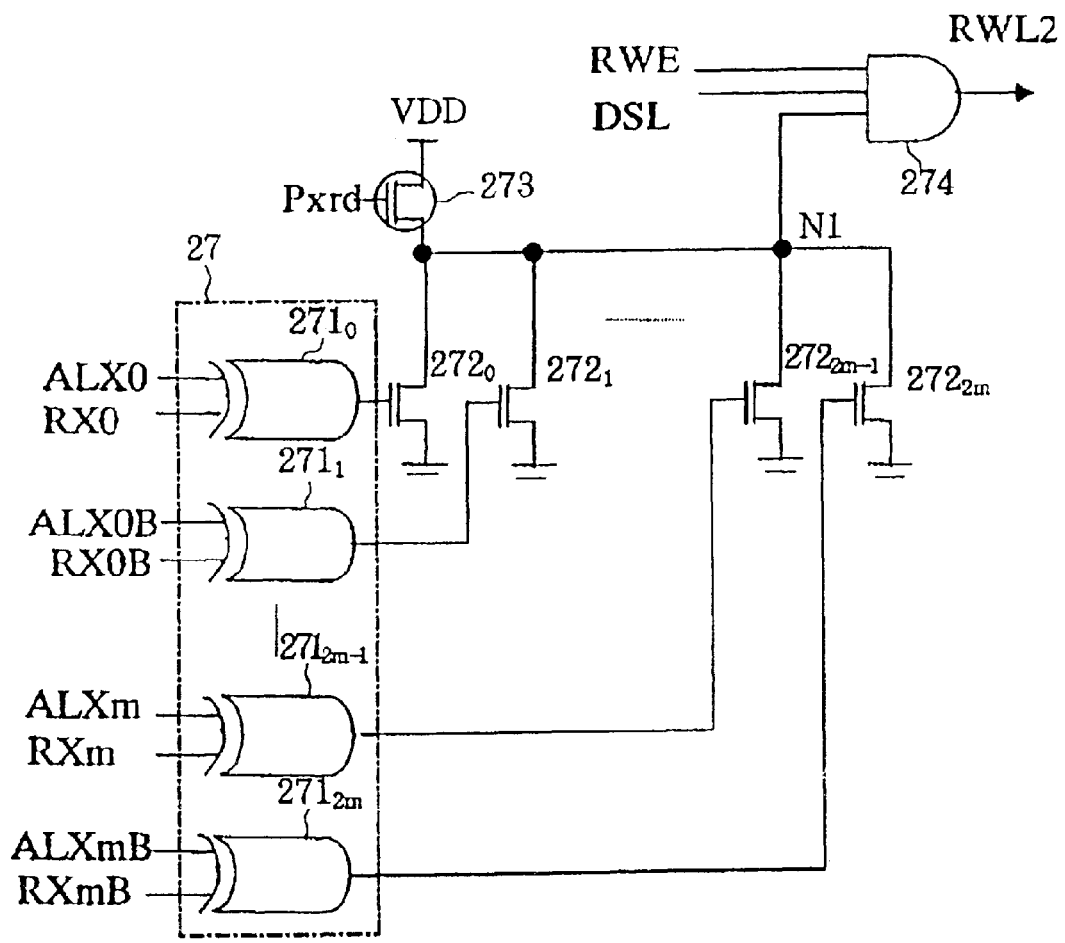
F I G. 14

METHOD OF RECOVERING MEMORY MODULE, MEMORY MODULE AND VOLATILE MEMORY

BACKGROUND OF THE INVENTION

1. Field of the Invention

The present invention relates to a memory module which is made up of a volatile memory such as DRAM, SRAM or the like as well as a re-writable non-volatile memory such as $E^2$PROM or the like.

2. Description of the Related Art

In recent information processing apparatuses such as personal computers, workstation server computers and the like, a main storage device has an increasingly larger storage capacity in line with a faster processing speed provided by a CPU and an increased number of bits processed thereby, resulting in employment of memory modules such as SIMM (Single Inline Memory Module), DIMM (Dual Inline Memory Module), MCP (Multi Chip Package) and the like.

FIG. 1 is a plan view illustrating an exemplary configuration of a memory module, and FIG. 2 is a side view illustrating an exemplary configuration of another memory module.

As illustrated in FIGS. 1 and 2, each of the memory modules comprises a plurality of volatile memories 1 such as DRAM, and re-writable non-volatile memory 2 such as $E^2$PROM, both of which are mounted on the same substrate 3. Specifically, FIG. 1 illustrates an exemplary configuration of SIMM (or DIMM), while FIG. 2 illustrates an exemplary configuration of MCP which has non-volatile memory 2 stacked on volatile memory 1.

These memory modules have a plurality of volatile memories 1 which are commonly applied with address signals A0–An (n is a positive integer) for writing/reading data; control signals RAS (Row address strobe command), CAS (Column address strobe command), WE (Write enable) for setting volatile memories 1 in a predetermined operation mode; and control signal CS (chip select) for selecting a memory to be activated. Each volatile memory 1 receives or delivers a DQ signal which is input/output data, and a DQM signal for masking the DQ signal in accordance with bits assigned to respective volatile memories 1.

A bank refers to a parallelly accessible memory area in a memory module which is selected by control signal CS. For example, in DIMM, volatile memories 1 mounted on one side of a substrate are set to bank 0, while non-volatile memories 1 mounted on the other side are set to bank 1.

On the other hand, non-volatile memory 2 previously stores information such as the configuration, type, characteristics and the like of the associated memory module, which is used by a system (information processing apparatus or the like) that is equipped with the memory module.

Next, the configuration of volatile memories 1 illustrated in FIGS. 1 and 2 will be described with reference to FIGS. 3 to 7. The volatile memory illustrated in FIG. 3 shows an exemplary configuration of conventional SDRAM (Synchronous DRAM).

AS illustrated in FIG. 3, conventional volatile memory 1 comprises memory cell array (MC ARRAY) 11 composed of a plurality of memory cells MC for storing data; a plurality of sense amplifiers 12 each for reading data stored in associated memory cell MC; row decoder (X DEC) 13 and column decoder (Y DEC) 14 for decoding address signal ADD for accessing memory cell into which data is written or from which data is read; a plurality of column switches (Y SW) 15 each for turning on/off the output of associated sense amplifier 12 in accordance with the result of decoding by column decoder 14; data latch circuit (D LAT) 16 for temporarily holding data which is to be written into memory cell MC; output latch circuit (O LAT) 17 for temporarily holding data read from memory cell MC; row address latch circuit (X ADD LAT) 18 for temporarily holding a row address supplied to row decoder 13; column address latch circuit (Y ADD LAT) 19 for temporarily holding a column address supplied to column decoder 14; command decoder (CMD DEC) 20 for decoding a control command supplied from the outside for setting volatile memory 1 in any of various operation mode; initial setting register (INT REG) 21 for holding mode setting information such as a CAS latency, a burst length and a burst type; control circuit (CONT) 22 for controlling a data write operation to memory cell array 11 and a data read operation from memory cell array 11 in response to an output signal of command decoder 20; data input buffer circuit 23 for receiving data supplied from the outside to pass the received data to data latch circuit 16; and data output buffer circuit 24 for delivering data fed from output latch circuit 17 to the outside.

In addition to normal memory cell area (NMC) 111 which is a memory cell area for normal use, memory cell array 11 also comprises redundant row memory cell area (X RNC) 112 and redundant column memory cell area (Y RNC) 113 which are formed with redundant memory cells for replacement in the event of a fault in any memory cell within normal memory cell area 111.

Row decoder 13 comprises normal row decoder (X NDEC) 131 and redundant row decoder (X RDEC) 132 associated with normal memory cell area 111 and redundant row memory cell area 112, respectively. Column decoder 14 in turn comprises normal column decoder (Y NDEC) 141 and redundant column decoder (Y RDEC) 142 associated with normal memory cell area 111 and redundant column memory cell area 113, respectively. Column switch 15 further comprises normal column switch (Y NSW) 151 and redundant column switch (Y RSW) 152 associated with normal memory cell area 111 and redundant column memory cell area 113, respectively.

As illustrated in FIG. 4, initial setting register 21 comprises n address latch circuits $210_1$–$210_n$ for holding address signals A0–An on a bit-by-bit basis; and a plurality of mode latch circuits 211 for holding control signals /RAS, /CAS, /WE, /CS, respectively. In synchronization with clock CLK applied from the outside, initial setting register 21 delivers latch signals IA0–IAn, IA0B–IAnB, control signals /RAS, /CAS, /WE, /CAS and their inverted versions. It should be noted that though FIG. 4 shows only one mode latch circuit 211, mode latch circuits 211 are provided corresponding to control signals /RAS, /CAS, /WE, /CS, respectively.

Command decoder 20 comprises latency setting decoder 201, burst length setting decoder 202 and burst type setting decoder 203 for decoding latch signals IA0–IAm, IA0B–IAmB (m is a positive integer smaller than n: m<n) out of latch signals IA0–IAn, IA0B–IAnB delivered from address latch circuits $210_1$–$210_n$ for use as the mode setting information, to deliver mode setting results which include the CAS latency, burst length and burst type; mode register setting decoder 204 for decoding control signals /RAS, /CAS, /WE, /CS delivered from mode latch circuit 211 to deliver mode register activation signal MRS; delay circuit 205 for delaying clock signal CLK applied from the outside by a predetermined time; logical AND gate 206 for delivering logical AND of mode register activation signal MRS and the clock signal delivered from delay circuit 205; and mode latch circuit $207_1$–$207_3$ for holding output signals of latency setting decoder 201, burst length setting decoder 202 and burst type setting decoder 203 in synchronization with a timing clock delivered from logical AND gate 206.

Initial setting register 21 and command decoder 20 illustrated in FIG. 4 function as mode registers, each of which holds data such as the CAS latency, burst length and burst type that are set using address signals A0–Am. Latency setting decoder 201, burst length setting decoder 202, and burst type setting decoder 203 deliver their respective decoding results when address signal Am+1 is "0". A latency signal, a burst length signal and a burst type signal delivered from mode latch circuits $207_1$–$207_3$, respectively, are held unchanged until next mode register activation signal MRS is delivered, or until the next mode setting is made.

As illustrated in FIG. 5, upon setting of the mode registers, control signals /RAS, /CAS, /WE, /CS, and latch signals IA0–IAm+1, IA0B–IAm+1B are fetched into volatile memory 1 in synchronization with a rising edge of clock CLK (held in address latch circuits $210_1$–$210_n$), and written into the mode registers in synchronization with a rising edge of the timing clock applied to mode latch circuits $207_1$–$207_3$.

Address signals A0–Am are used for setting the CAS latency, burst length and burst type, while address signal Am+1 is set to "0" when the mode registers are set.

As illustrated in FIG. 6, redundant row decoder 132 comprises redundant row decoder transistors $133_0$–$133_{2m}$ which have their drains and sources connected in common and are turned on/off under control of internal row address signals ALX0–ALXm, ALX0B–ALXmB delivered from row address latch circuit 18; precharge transistor 134 which is turned on/off under control of precharge signal Pxrd delivered from control circuit 22 for supplying power supply voltage VDD to the drains of respective redundant row decoder transistors $133_0$–$133_{2m}$; and logical AND gate 135 for delivering logical AND of an output signal of precharge transistor 134 and selection signal RWE delivered from control circuit 22 for selecting a redundant word line.

Redundant row decoder transistors $133_0$–$133_{2m}$ have their sources connected to a ground, and are provided with fuse element $136_0$–$136_{2m}$, which can be cut by laser light, between their drains and node N1, respectively.

Fuse elements $136_0$–$136_{2m}$ are blown out by laser light based on a row address of a memory cell which is determined as defective in a test after wafer manufacturing. For example, when a fault occurs in a memory cell which has the least significant bit set at "1" and the remaining bits set at "0", all fuse elements 136, which are cut in this event, are provided at the drains of those redundant row decoder transistors 133 which are applied with internal row address signals ALX0, ALX0B–ALXmB. In another example, when a fault occurs in a memory cell which has the least significant bit set at "0" and the remaining bits set at "1", all fuse elements 136 which are cut in this event, are provided at the drains of those redundant row decoder transistors 133 which are applied with internal row address signals ALX0B, ALX0–ALXm.

With the use of plurality of such fuse elements which can be blown out by laser light for holding information for accessing a redundant memory cell through laser trimming, application of row address signals A0–Am corresponding to a memory cell determined as defective causes connection node N between redundant row decoder transistor 133 and precharge transistor 134 to go to "High" (VDD), resulting in activation of output signal RWL1 from logical AND gate 135. Since the output line of logical AND gate 135 serves as a word line in redundant row memory cell area 112, the application of the address of a memory cell determined as defective results in an access to a memory connected to activated word line RWL1 in redundant row memory cell area 112 instead of that memory cell.

Redundant row decoder 132 comprises a plurality of sets of redundant row decoder transistors $133_0$–$133_{2m}$, precharge transistor 134 and logical AND gate 135, illustrated in FIG. 6, such that when a plurality of defective memory cells are detected, the laser trimming is performed for each of sets corresponding to the addresses of the respective defective memory cells.

As illustrated in FIG. 7, conventional redundant column decoder 142 is similar in configuration to redundant row decoder 132 illustrated in FIG. 6, and comprises redundant column decoder transistors $143_0$–$143_{2m}$ which have their drains and sources connected in common and are turned on/off under control of internal column address signals ALY0–ALYm, ALY0B–ALYmB delivered from column address latch circuit 19; precharge transistor 144 which is turned on/off under control of precharge signal Pyrd delivered from control circuit 22 for supplying power supply voltage VDD to the drains of respective redundant column decoder transistors $143_0$–$143_{2m}$; and logical AND gate 145 for delivering logical AND of an output signal of precharge transistor 144 and selection signal RYE delivered from control circuit 22 for selecting a redundant word line. Redundant column decoder transistors $143_0$–$143_{2m}$ have their source connected to the ground, and are provided with fuse elements $146_0$–$146_{2m}$, which can be cut by laser light, between their drains and node N2, respectively.

Fuse elements $146_0$–$146_{2m}$ are blown out by laser light based on a column address of a memory cell which is determined as defective in a test after wafer manufacturing, in a manner similar to redundant row decoder 132.

The remaining memory cell array 11, sense amplifiers 12, normal row decoder circuit 131, normal column decoder circuit 141, column switch 15, data latch circuit 16, output latch circuit 17, row address latch circuit 18, column address latch circuit 19, control circuit 22, data input buffer circuit 23, and data output buffer circuit 24 are not directly related to the present invention in configuration, so that detailed description thereon is omitted. These circuits may be implemented by any known configurations as long as they satisfy predetermined functions. Also, non-volatile memory 2 may be in any known configuration as long as it is re-writable, for example, E²PROM.

Next, a conventional procedure of manufacturing the memory module in the foregoing configuration will be described with reference to FIGS. 8 and 9.

FIG. 8 is a flow chart illustrating a general procedure of manufacturing a memory module, and FIG. 9 is a flow chart illustrating a processing procedure for conducting an electric test on a conventional memory module.

As illustrated in FIG. 8, first, in a memory module manufacturing process, memory cell array is tested at the time a wafer for volatile memories 1 has been manufactured to identify defective memory cells, at step S1.

Next, a defect recovery is performed for substituting a redundant memory cell for a defective memory cell through the aforementioned laser trimming, at step S2, followed by a test which is conducted again on the wafer to determine whether memory cell array 11 passes or fails, at step S3.

Subsequently, a wafer determined as good in the test is accommodated in a mold package for assembling volatile memory 1, at step S4.

Next, a first electric test is conducted on assembled volatile memory 1 to confirm the performance of individual volatile memory 1, at step S5.

Next, after a burn-in test is conducted in a predetermined condition, at step S6, a second electric test is conducted on volatile memory 1 to confirm the performance after the burn-in test, at step S7. If no defect is found in the second electric test, individual volatile memory 1 is completed, at step S8.

Next, completed individual volatile memory 1, and non-volatile memory 2 manufactured in a similar process are introduced into a memory module manufacturing process, at step S9, wherein volatile memory 1 and non-volatile memory 2 are each mounted on substrate 3 of the memory module, at step S10.

Subsequently, volatile memory 1 and non-volatile memory 2 are each fixed on substrate 3 of the memory module, followed by a solder reflow step which connects a circuit pattern formed on substrate 2 to external terminals of volatile memory 1 and non-volatile memory 2 by soldering, at step S11.

Finally, an electric test is conducted on the memory module, at step S12, and the memory module is completed when no defect is detected, at step S13.

As illustrated in FIG. 9, the electric test for a memory module involves initially writing predetermined data into a non-volatile memory (E²PROM) mounted on the substrate of the memory module, and reading the written data to verify the contents, at step S21.

Next, a plurality of volatile memories mounted on the same substrate are tested in a similar procedure to that for the non-volatile memory, at step S22.

Then, it is confirmed from the result of the test whether or not any defect is found, at step S23, and the memory module is completed if no defect is found. Conversely, if any defect is found, a defective volatile memory is replaced with a new volatile memory, at step S24, followed by the procedure returning to step 22, where the electric test is again conducted on the volatile memory mounted on the memory module.

As described above, in the conventional memory module manufacturing process, a test is conducted at the end of wafer manufacturing to identify defective memory cells which are replaced with redundant memory cells previously formed on the same wafer to recover the defective memory.

However, in recent volatile memories, non-volatile memories and the like, increasing miniaturization of memory cells causes an increasingly lower yield rate. In addition, a larger proportion of memory cells are made defective due to stresses applied thereto during the burn-in test which is conducted after the assembly of the memory. Furthermore, as an increased number of volatile memories and non-volatile memories are mounted on the same substrate of a memory module, a lower yield rate is also presented by the memory modules. Though determined as good in the electric test on individual memories, not a few products are made defective due to a thermal stress applied thereto in the solder reflow step for the assembly into a module.

Basically, there is no other choice but to discard those semiconductor memories determined as defective in the electric test on individual memories or the electric test on memory modules. Particularly, when determined as defective in the electric test on memory modules, since defective memories are manually replaced with new memories, a long working time required therefor constitutes a factor of increasing the cost of the memory module.

SUMMARY OF THE INVENTION

It is therefore an object of the present invention to provide a method of recovering a memory module, which is capable of recovering a defective memory cell without replacement, even if it is determined so in an electric test conducted thereon, and to provide a memory module.

To achieve the above object, the present invention involves previously storing a defective row address and a defective column address corresponding to a memory cell in a volatile memory determined as defective, and defective device information for discriminating the volatile memory determined as defective in a non-volatile memory, transferring the defective row address, defective column address and defective device information stored in the non-volatile memory to a volatile memory upon start-up of a system equipped with the memory module for holding the transferred defective row address, defective column address and defective device information in the volatile memory, and accessing a redundant memory cell instead of the memory cell in the volatile memory determined as defective when a fed address corresponds to the defective memory cell, based on the defective row address, defective column address and defective device information held in the volatile memory.

Thus, even if a defect is found in a memory cell of the volatile memory in an electric test on the memory module, the defective memory cell can be recovered, thereby improving the yield rate for the memory module. In addition, since neither replacement nor discard is needed for a volatile memory in which a defect is found, it is possible to prevent an increased cost of the memory module due to an increased working time which would otherwise be required for replacement or discard.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 11 is a schematic diagram showing bit sequences of defective device information and defective address information stored in the volatile memory illustrated in FIG. 10;

FIG. 14 is a circuit diagram illustrating an exemplary configuration of a row address comparator and a redundant row decoder shown in FIG. 10;

DETAILED DESCRIPTION OF THE PREFERRED EMBODIMENTS

Next, the present invention will be described with reference to the accompanying drawings.

In the present invention, a defective row address and defective column address (hereinafter the defective row address and defective column address may be collectively referred to as the "defective address") corresponding to a memory cell in a volatile memory in which a defect is detected in an electric test on a memory module are stored in a non-volatile memory mounted on the same memory module. The non-volatile memory also stores defective device information for discriminating a volatile memory in which a defect is detected in the electric test on the memory module.

A volatile memory comprises a defect information storage circuit for holding defective address information which is transferred from a non-volatile memory through a memory control circuit contained in a system upon start-up of the system; and a device information storage circuit for determining from the defective device information whether or not the defective address information is related to the memory itself to hold the result of the determination. Based on the information held in the defect information storage circuit and device information storage circuit, when the volatile memory is applied with an address signal corresponding to a memory cell in which a defect has been detected (defective memory cell), an access is switched from the normal memory cell to a redundant memory cell. This strategy recovers volatile memories which are determined as defective in an electric test on memory modules.

The memory control circuit transfers the defective address information and defective device information read from the non-volatile memory to the volatile memory through a DQM terminal and address terminals.

Figure 1:
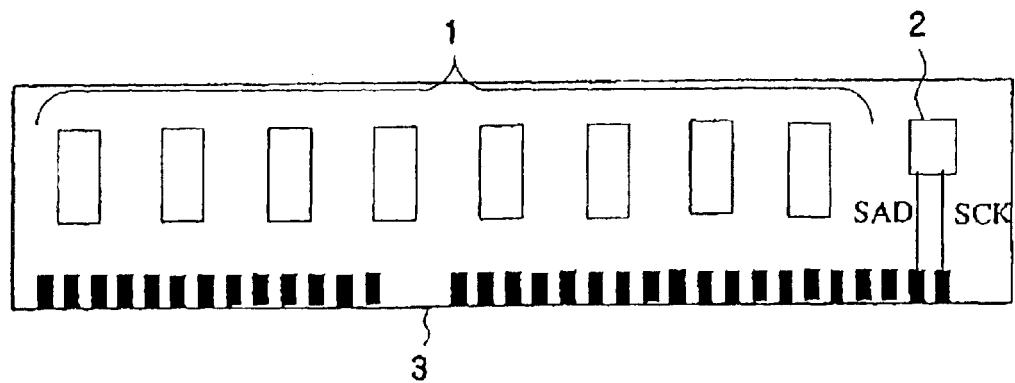
FIG. 1 is a plan view illustrating an exemplary configuration of a memory module.
Figure 2:
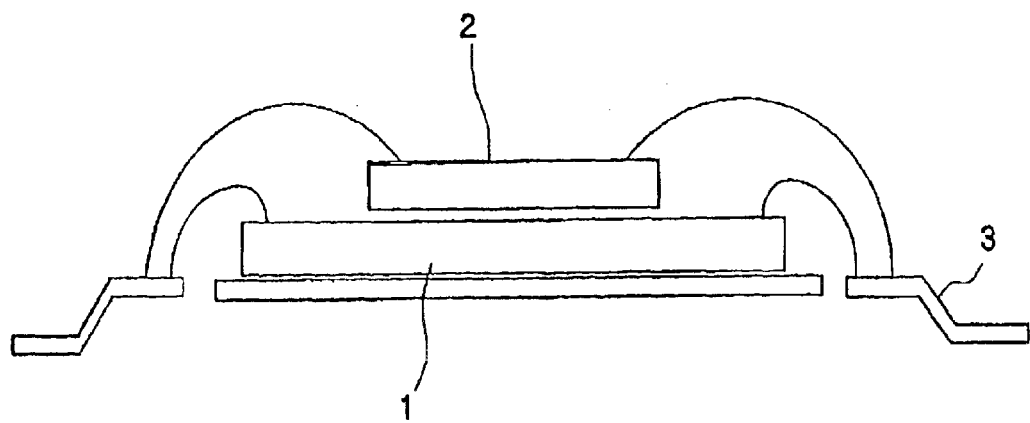
FIG. 2 is a side view illustrating an exemplary configuration of another memory module.
Figure 3:
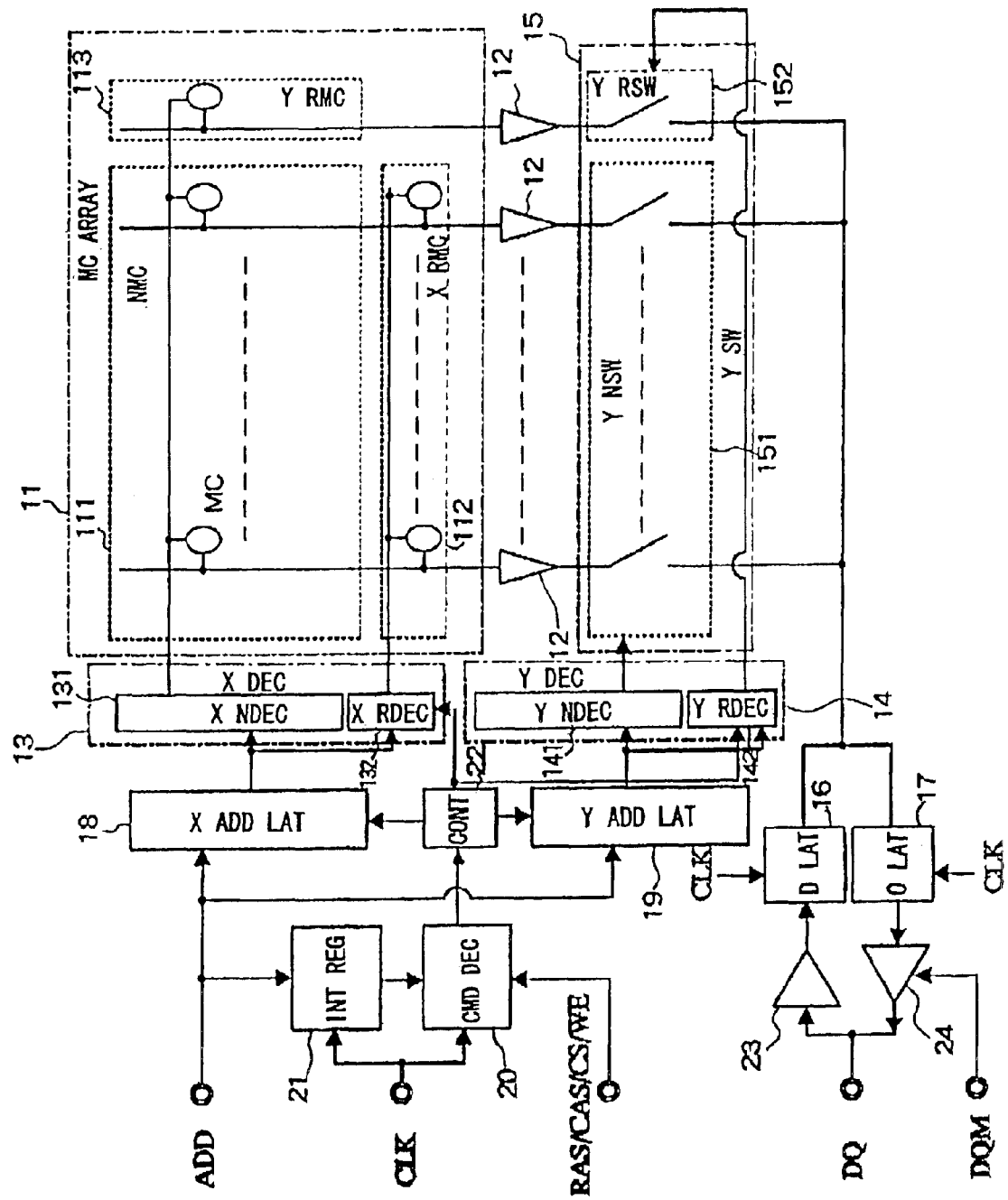
FIG. 3 is a block diagram illustrating the configuration of a conventional volatile memory.
Figure 4:
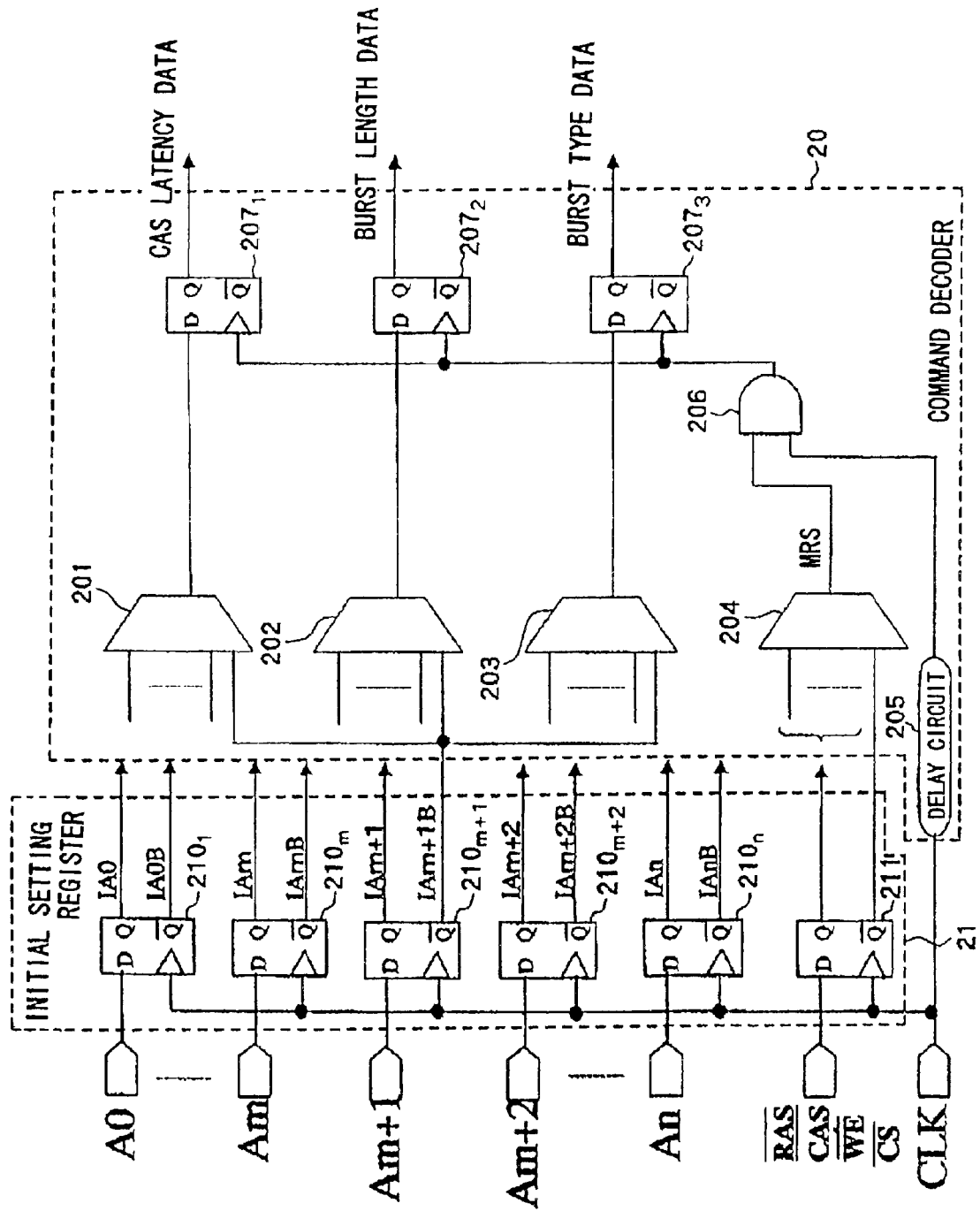
FIG. 4 is a circuit diagram illustrating an initial setting register and a command decoder shown in FIG. 3.
Figure 5:
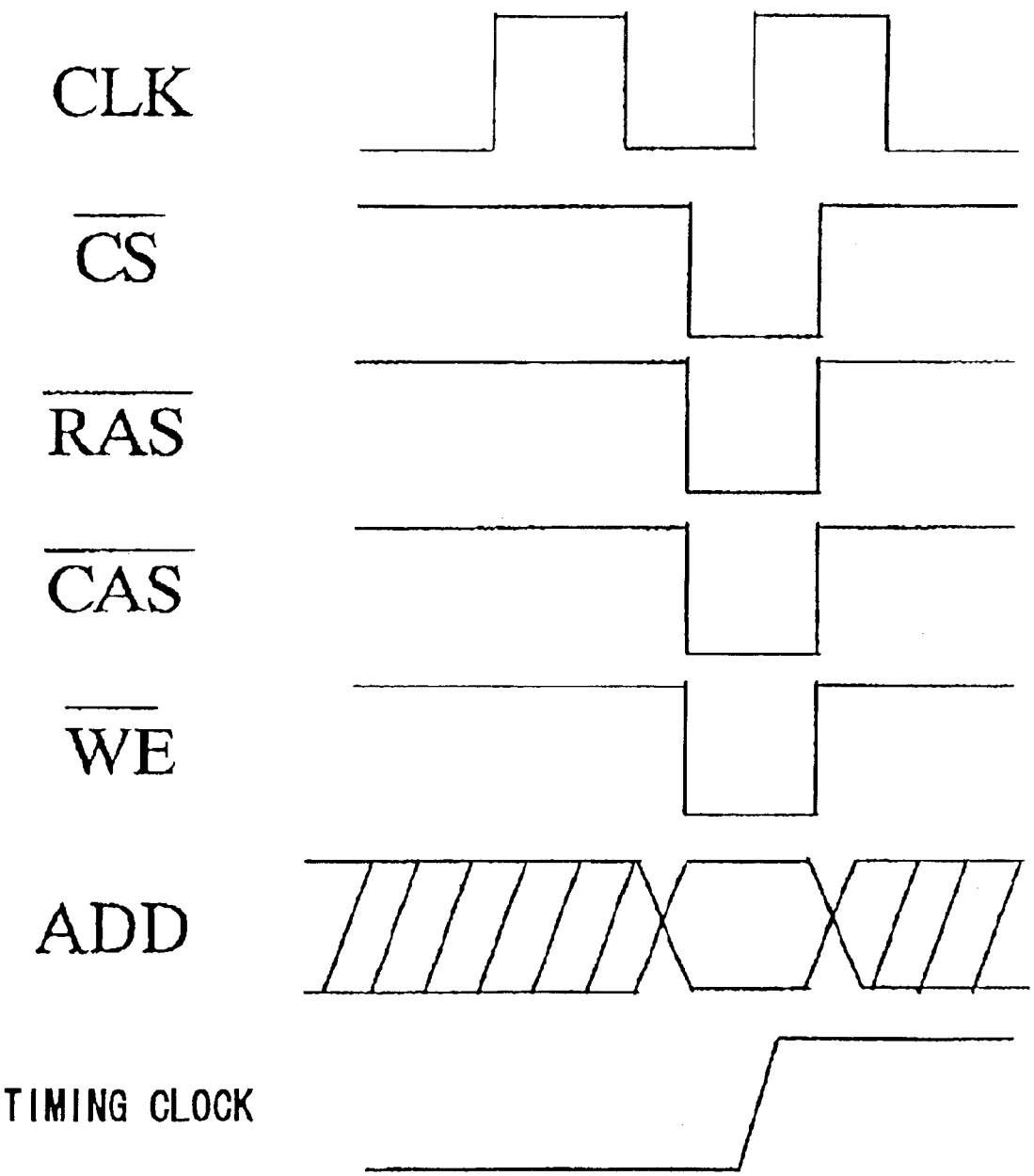
FIG. 5 is a timing chart illustrating the operation of the initial setting register and command decoder shown in FIG. 3.
Figure 6:
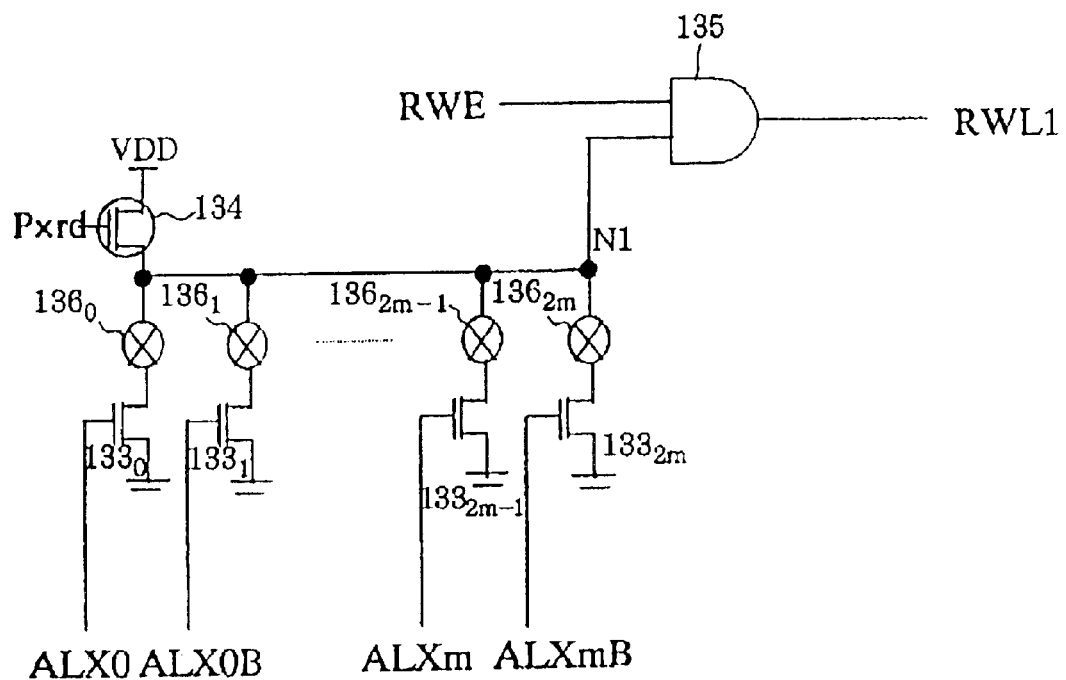
FIG. 6 is a circuit diagram illustrating the configuration of a redundant row decoder shown in FIG. 3.
Figure 7:
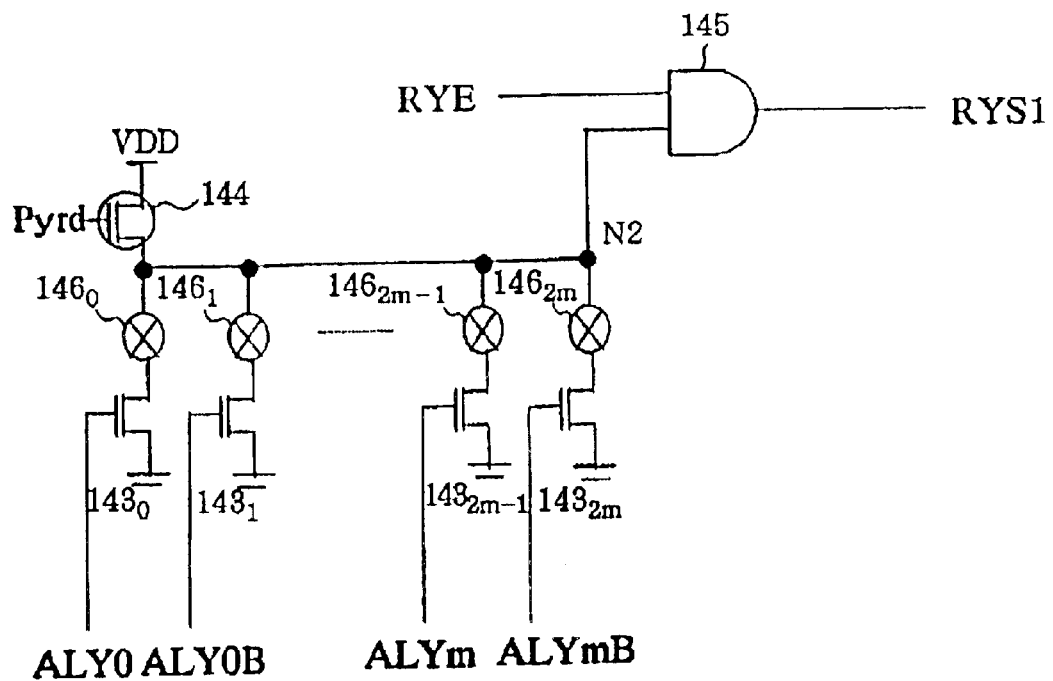
FIG. 7 is a circuit diagram illustrating the configuration of a redundant column decoder shown in FIG. 3.
Figure 8:
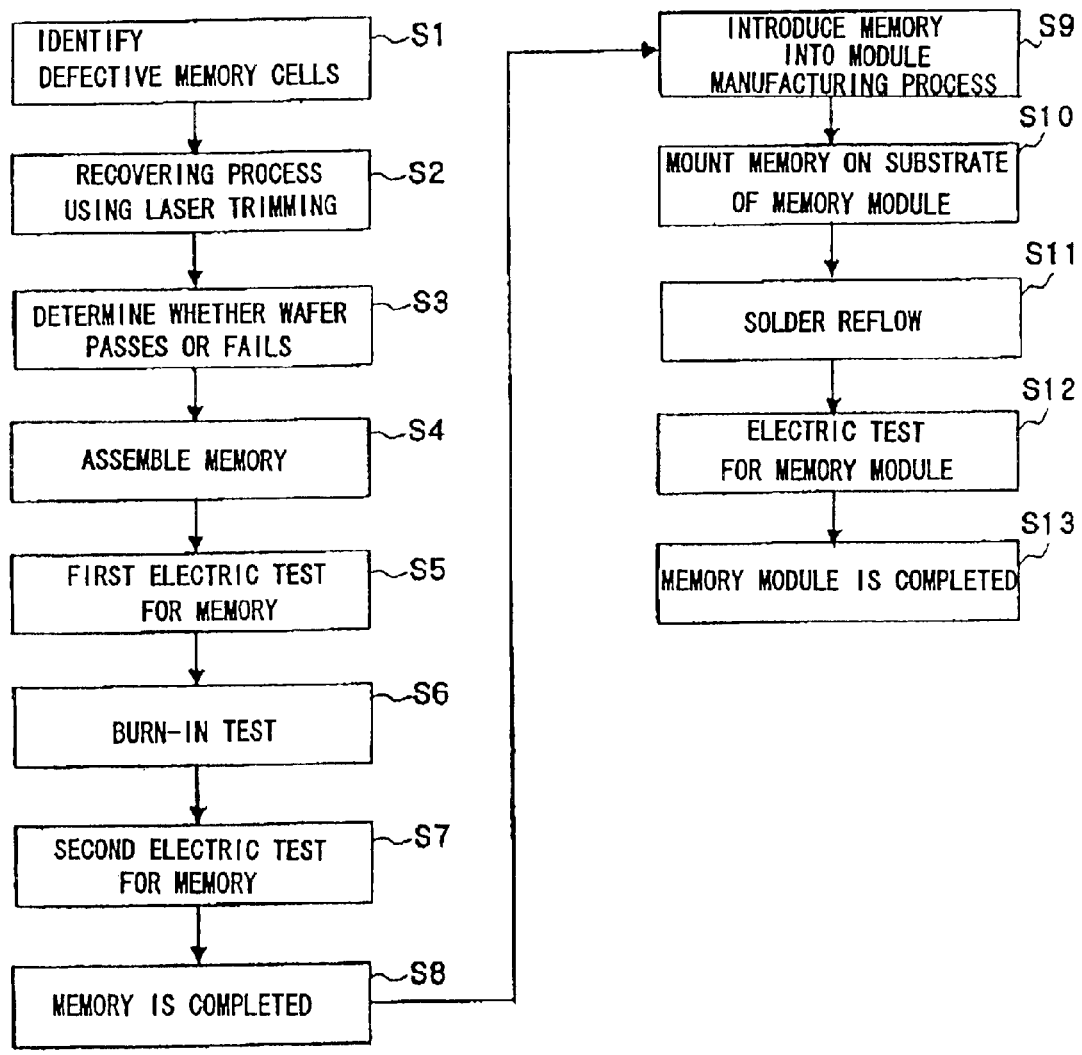
FIG. 8 is a flow chart illustrating a general procedure of manufacturing a memory module.
Figure 9:
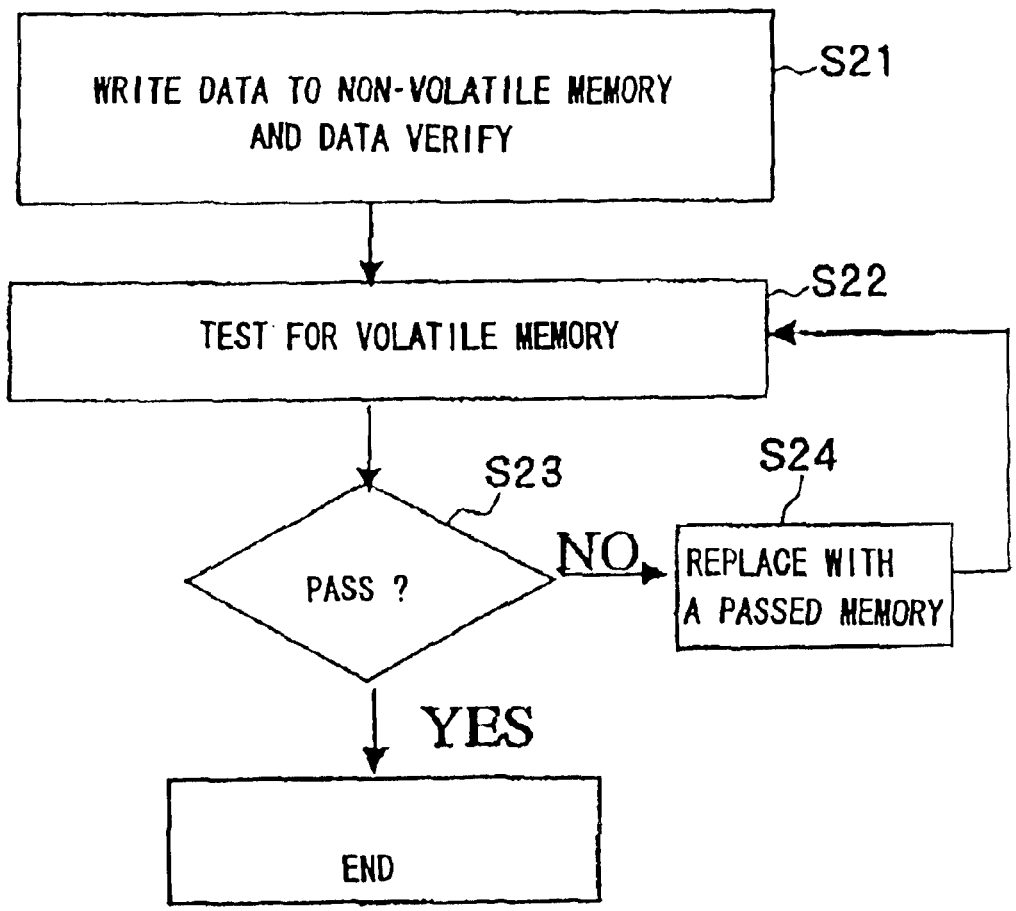
FIG. 9 is a flow chart illustrating a conventional processing procedure for an electric test conducted on a memory module.
Figure 10:
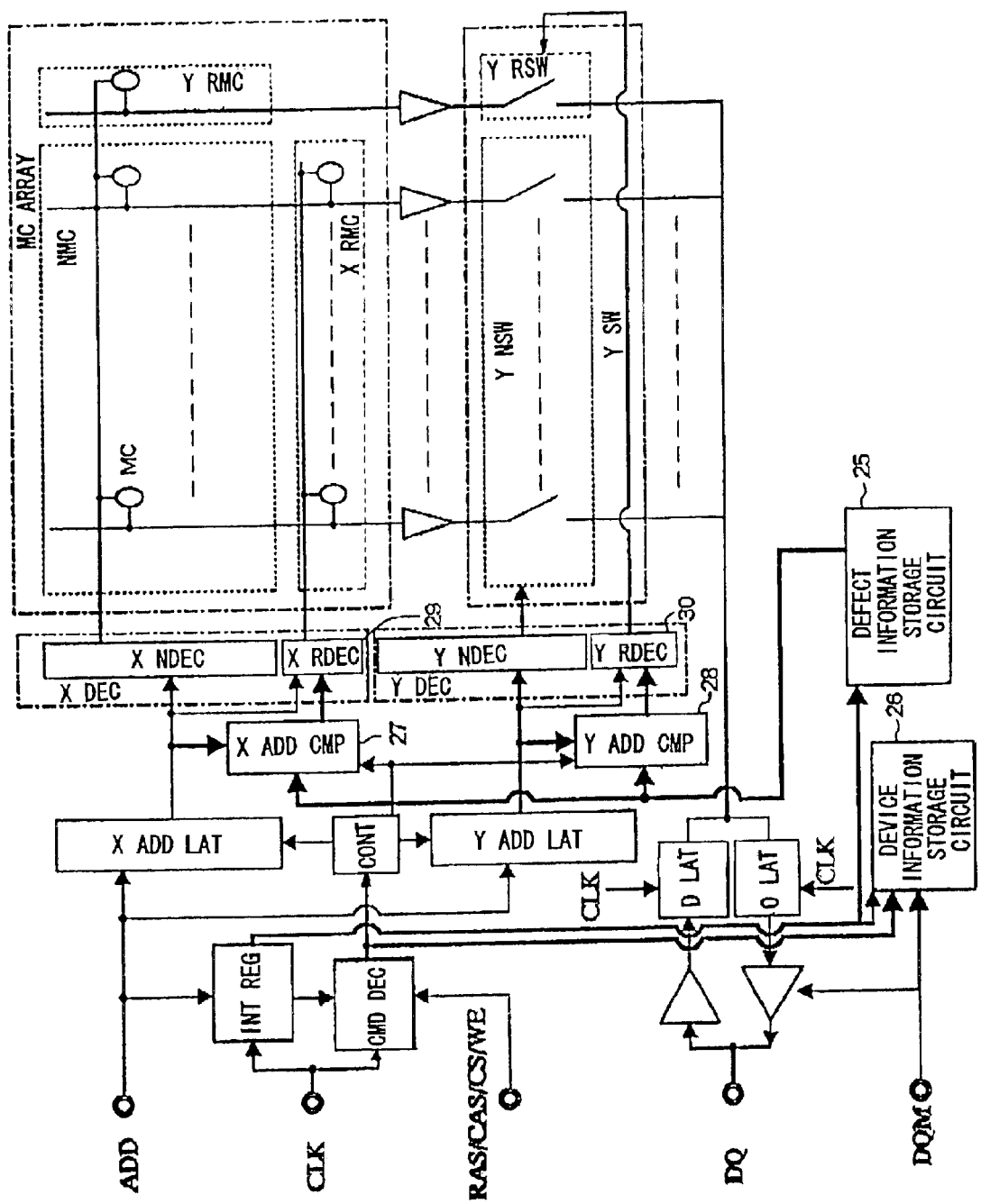
FIG. 10 is a block diagram illustrating an exemplary configuration of a volatile memory which may be mounted in a memory module according to the present invention.

As illustrated in FIG. 10, a volatile memory according to the present invention comprises, in addition to the configuration of the conventional volatile memory illustrated in FIG. 3, defect information storage circuit 25 for holding defective address information; device information storage circuit 26 for determining from the defective device information whether or not the defective address information is related to the memory itself to hold the result of the determination; row address comparator (X ADD CMP) 27 for comparing defective row addresses RX0–RXm, RX0B–RXmB stored in defect information storage circuit 25 with internal row addresses ALX0–ALXm, ALX0B–ALXmB supplied from row address latch circuit; and column address comparator (Y ADD CMP) 28 for comparing defective column addresses RY0–RYm, RY0B–RYmB stored in defect information storage circuit 25 with internal column addresses ALY0–ALYm, ALY0B–ALYmB supplied from a column address latch circuit.

As shown in FIG. 11, in this embodiment, bits A0–Am are used out of address signals A0–An to transfer the defective device information and defective address information from the non-volatile memory to the volatile memory. In addition, bits Am+1–Am+3 are used to identify whether bits A0–Am indicate defective device information, a defective row (X) address, or a defective column (Y) address. It should be noted that since bit Am+1 is set to "0" upon normal mode register setting, it is set to "1" when the present invention is applied to distinguish from normal mode register settings.

Specifically, assume herein that when bits Am+3, Am+2, Am+1 are "001", the defective device information is transferred using bits A0–Am; when bits Am+3, Am+2, Am+1 are "011", a defective row (X) address is transferred using bits A0–Am; when bits Am+3, Am+2, Am+1 are "101", a defective column (Y) address is transferred using bits A0–Am.

Also, in this embodiment, the defective device information is made up of a defect recovery number which is transferred using bit Am, and module bank information which is transferred using bit Am−1. The defect recovery number is information for identifying two defective memory cells, if existing in the non-volatile memory, while the module bank information indicates a bank of the memory module selected by control signal /CS. In other words, the module bank information is consistent with control signal /CS.

The defective device information further includes a DQM signal for permitting the volatile memory to determine a defective device or not. While the DQM signal is essentially a signal for masking a DQ signal, it is converted to the defective device information by establishing a correspondence of information indicating a defective device or not to the DQM signal by a memory control circuit contained in the system when the defective device information is transferred from the non-volatile memory.

Figure 12:
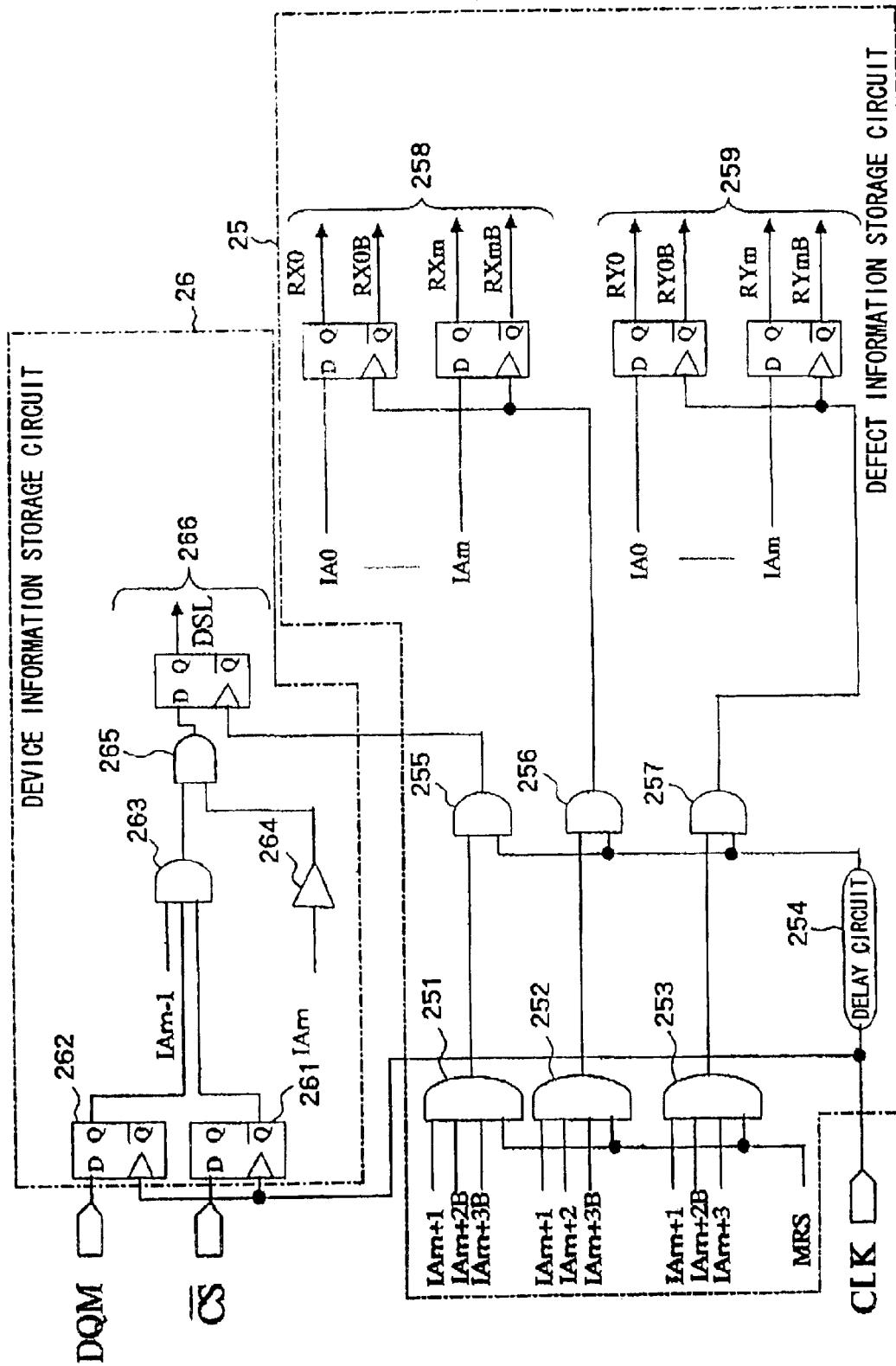
FIG. 12 is a circuit diagram illustrating an exemplary configuration of a defective information storage circuit and a device information storage circuit shown in FIG. 10.

As illustrated in FIG. 12, device information storage circuit 26 comprises latch circuit 261 for holding control signal /CS in synchronization with clock CLK; latch circuit 262 for holding the DQM signal for recognizing a defective device or not in synchronization with clock CLK; logical AND gate 263 for delivering logical AND of control signal /CS and latch signal IAm−1; buffer circuit 264 for receiving latch signal IAm; logical AND gate 265 for delivering logical AND of an output signal of buffer circuit 264 and an output signal of logical AND gate 263; and device information storage register 266 comprised of a flip flop which delivers a signal received from logical AND gate 265 as a DSL signal in synchronization with a timing clock applied from defect information storage circuit 25.

Device information storage circuit 26 illustrated in FIG. 12 is an exemplary circuit for use in recovering one defective memory cell. For example, if there is another defective memory cell, a buffer circuit for receiving latch signal IAmB is added to device information storage circuit 26 illustrated in FIG. 12, and an output signal of the buffer circuit is applied to logical AND gate 265. In this way, two defective memory cells can be recovered using the DSL signal.

On the other hand, defect information storage circuit 25 comprises logical AND gates 251–253 for decoding latch signal IAm+1–IAm+3, IAm2B, IAm3B, respectively, to deliver the results of the decoding for determining whether bits A0–Am indicate defective device information, defective row (X) address or defective column (Y) address; delay circuit 254 for delaying clock signal CLK applied from the outside by a predetermined time; defective row address storage register 258 composed of a plurality of flip-flops for latching a defective row address supplied thereto using bits A0–Am; defective column address storage register 259 composed of a plurality of flip-flops for latching a defective column address supplied thereto using bits A0–Am; and logical AND gates 255–257 for delivering logical AND of an output signal of associated logical AND gate 251–253 and an output signal of delay circuit 254, and supplying a timing clock for holding information in device information storage register 266, defective row address storage register 258, and defective column address storage register 259. Latch signals IA0–IAm, IAm−2–IAm, IAm+1–IAm+3, IAm2B, IAm3B are latched outputs of address signals A0–Am+3, and are supplied from an address latch circuit contained in the initial setting register shown in FIG. 10.

Figure 13:
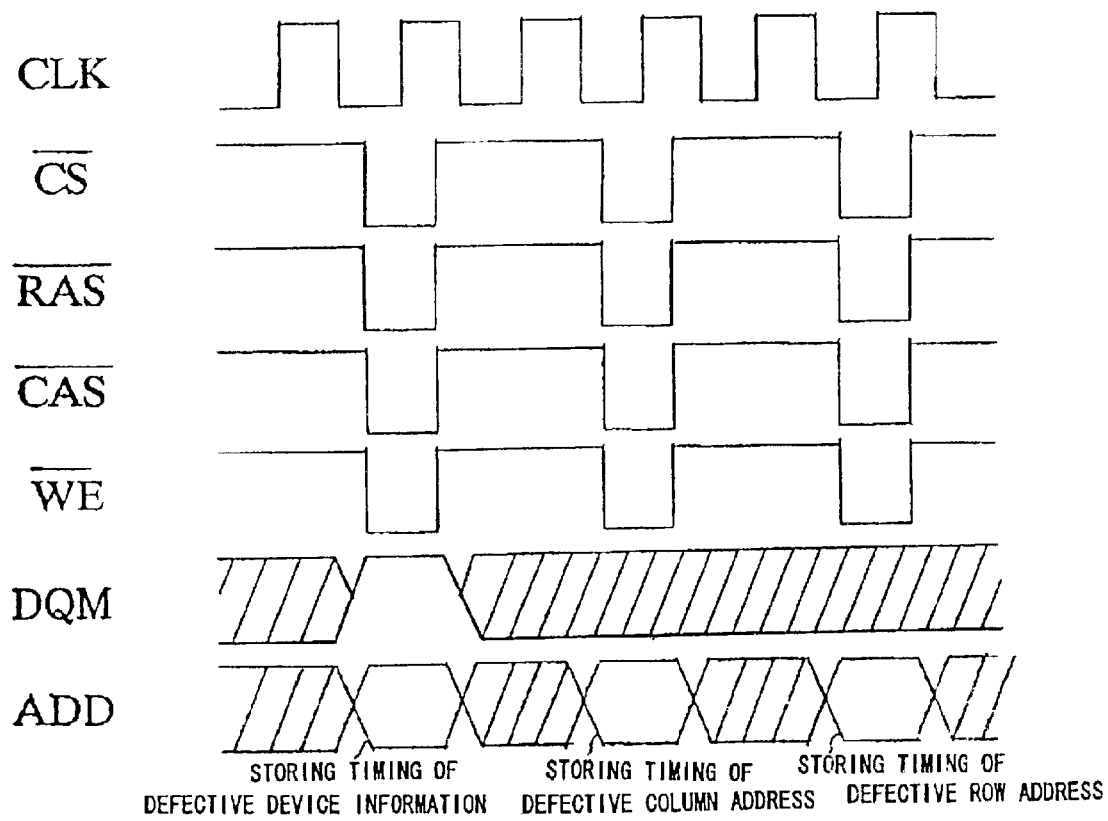
FIG. 13 is a timing chart showing timings at which defective device information and defective address information are stored in the volatile memory illustrated in FIG. 10.

As illustrated in FIG. 13, control signals /RAS, /CAS, /WE, /CS are fetched into the volatile memory in synchronization with a rising edge of clock CLK, transferred from the non-volatile memory to the volatile memory in the order of the defective device information, defective row address and defective column address, and stored in device information storage circuit 26 and defective information storage circuit 25. In this event, the defective device information is fetched from a DQM terminal and address terminals of the volatile memory through the memory control circuit contained in the system, while the defective address information is fetched from the address terminals of the volatile memory through the memory control circuit contained in the system.

As illustrated in FIG. 14, row address comparator 27 comprises EXOR gates $271_0$–$271_{2m}$ for delivering bit by bit exclusive logical OR of internal row address signals ALX0–ALXm, ALX0B–ALXmB delivered from row address latch circuit 18, and defective row address signals RX0–RXm, RX0B–RXmB stored in defective information storage circuit 25.

Redundant row decoder 29 in this embodiment comprises, in addition to the configuration of a conventional redundant row decoder, redundant row decoder transistors $272_0$–$272_{2m}$ which have their drains and sources connected in common and are turned on/off under control of output signals of EXOR gates $271_0$–$271_{2m}$; precharge transistor 273 which is turned on/off under control of precharge signal Pxrd delivered from the control circuit for supplying power supply voltage VDD to the drains of respective redundant row decoder transistors $272_0$–$272_{2m}$; and logical AND gate 274 for delivering logical AND of an output signal of precharge transistor 273 and the DSL signal delivered from device information storage circuit 26. Redundant row decoder transistors $272_0$–$272_{2m}$ have their respective sources connected to the ground.

In the foregoing configuration, application of row address signals A0–Am corresponding to a memory cell determined as defective causes EXOR gates $271_0$–$271_{2m}$ included in row address comparator 27 to deliver Low level therefrom, so that respective redundant row decoder transistors $272_0$–$272_{2m}$ turn off to bring connection node N1 between redundant row decoder transistor 272 and precharge transistor 273 to High level (VDD), causing output signal RWL2 of logical AND gate 274 to activate. Since the output line of logical AND gate 274 serves as a word line in redundant row memory cell area, application of the address of a memory cell determined as defective results in an access to a memory cell connected to activated word line RWL2 in redundant row memory cell area 112 instead of the defective memory cell.

Figure 15:
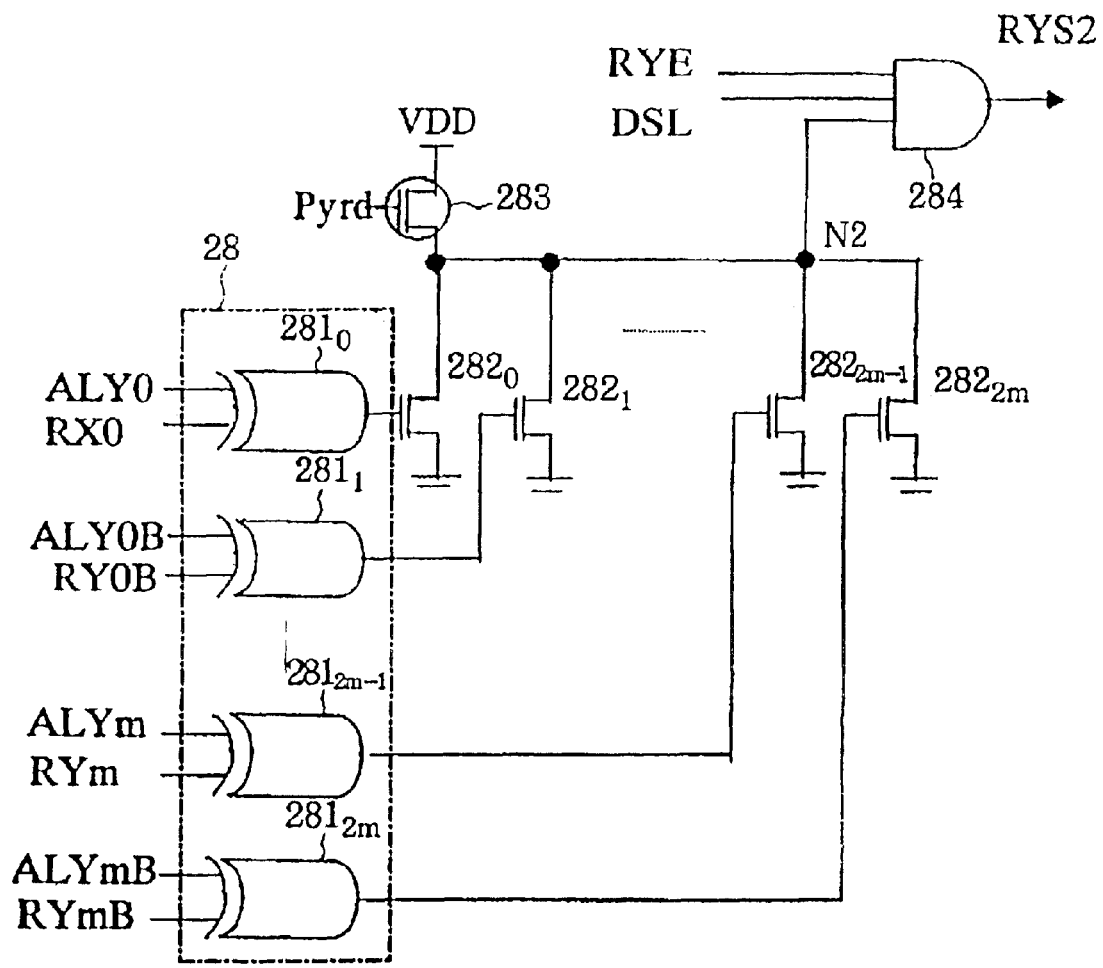
FIG. 15 is a circuit diagram illustrating an exemplary configuration of a column address comparator and a redundant column decoder shown in FIG. 10.

As illustrated in FIG. 15, column address comparator 28 comprises EXOR gates $281_0$–$281_{2m}$ for delivering bit by bit exclusive logical OR of internal row address signals ALY0–ALYm, ALY0B–ALYmB delivered from column address latch circuit 19, and defective column address signals RY0–RYm, RY0B–RYmB stored in defective information storage circuit 25.

Redundant column decoder 30 in this embodiment comprises, in addition to the configuration of a conventional redundant column decoder, redundant column decoder transistors $282_0$–$282_{2m}$ which have their drains and sources connected in common and are turned on/off under control of output signals of EXOR gates $282_0$–$282_{2m}$; precharge transistor 283 which is turned on/off under control of precharge signal Pyrd delivered from the control circuit for supplying power supply voltage VDD to the drains of respective redundant row decoder transistors $282_0$–$282_{2m}$; and logical AND gate 284 for delivering logical AND of an output signal of precharge transistor 283 and the DSL signal delivered from device information storage circuit 26. Redundant row decoder transistors $282_0$–$282_{2m}$ have their respective sources connected to the ground.

In the foregoing configuration, like row address comparator 28 and redundant row decoder 29 illustrated in FIG. 14, application of column address signals A0–Am corresponding to a memory cell determined as defective causes EXOR gates $281_0$–$281_{2m}$ included in column address comparator 28 to deliver Low level therefrom, so that respective redundant row decoder transistors $282_0$–$282_{2m}$ turn off to bring connection node N2 between redundant column decoder transistor 282 and precharge transistor 283 to High level (VDD), causing output signal RYS2 of logical AND gate 284 to activate. Since the output line of logical AND gate 284 serves as a bit line in redundant column memory cell area, application of the address of a memory cell determined as defective results in an access to a memory connected to activated word line RYS2 in redundant column memory cell area 113 instead of the defective memory cell.

Next, referring to FIG. 16, description will be made on a processing procedure for an electric test on the memory module according to the present invention which has the volatile memory in the foregoing configuration.

Figure 16:
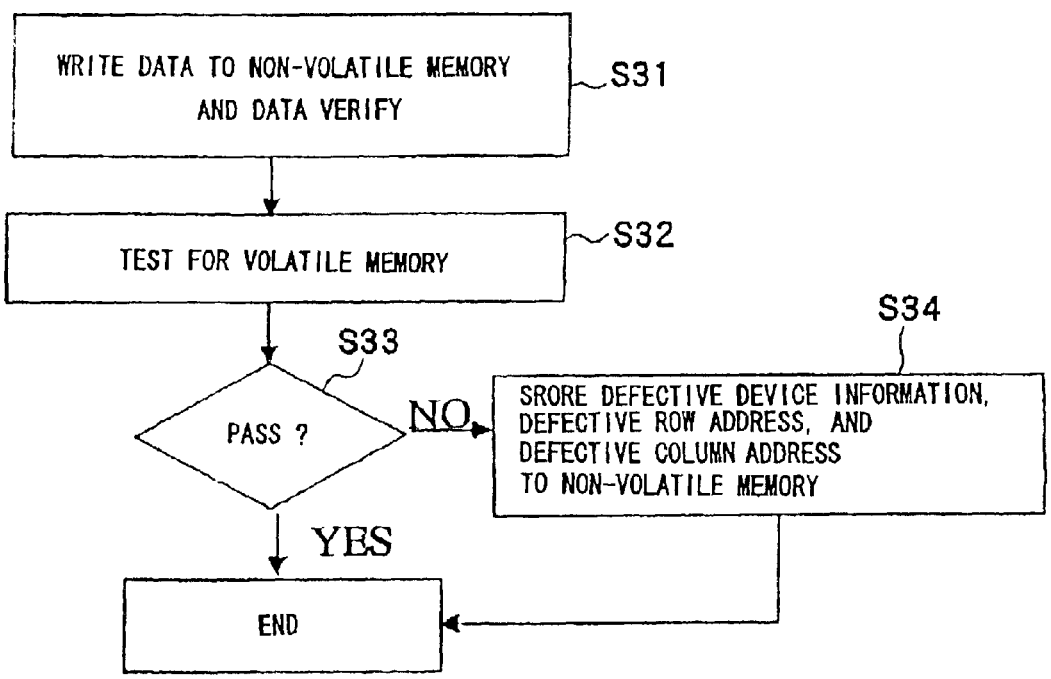
FIG. 16 is a flow chart illustrating a processing procedure for an electric test on the memory module according to the present invention.

As illustrated in FIG. 16, the electric test on the memory module according to the present invention involves initially writing predetermined data into a non-volatile memory ($E^2$PROM) mounted on the substrate of the memory module, and reading the written data to verify the contents, at step S31, as done in the prior art.

Next, a test is conducted on a plurality of volatile memories mounted on the same substrate, at step S32. Then, the presence or absence of defects is confirmed from the result of the test, at step S33, and the memory module is completed if no defect is found (pass). Conversely, if any defect is found, written into the non-volatile memory are defective device information on a volatile memory which suffers from a defect, and a defective row address and a defective column address corresponding to a memory cell in the volatile memory in which the defect is found, at step S34, followed by completion of the memory module.

Thus, according to the present invention, even if a defect is found in a memory cell of a volatile memory in an electric test on a memory module, the defective memory cell can be recovered, thereby improving the yield rate of the memory module. In addition, since neither replacement nor discard is needed for a volatile memory in which a defect is found, it is possible to prevent an increased cost of the memory module due to an increased working time.

While the present invention proposes a method which involves previously storing defective device information and defective address information in a non-volatile memory, and transferring such information to a volatile memory upon start-up of a system for storage, an alternative method of recovering a memory module may involve maintaining defective device information and defective address information stored in a non-volatile memory without transferring to a volatile memory, and reading such information from the non-volatile memory each time the volatile memory is accessed. Another alternative method of recovering a memory module may involve holding defective address information in a non-volatile register within a volatile memory and reading the information from the register.

However, when the information is retrieved from the non-volatile memory each time the volatile memory is accessed, a longer time is required for reading/writing data from/into the volatile memory, resulting in a slower access time for reading/writing data from/into the volatile memory. On the other hand, when the defective address information is stored in the register provided in the volatile memory, an extra time is required for accessing the register, resulting in a longer access time to the non-volatile memory, as compared with information held in a plurality of fuse elements, which can be blown out by laser light, for accessing a redundant memory cell.

In the present invention, since the defective device information, defective row address and defective column address are transferred to the volatile memory upon start-up of a system which is equipped with the memory module, a subsequent access to the non-volatile memory is eliminated, thereby minimizing a delay in accessing the volatile memory.

Generally, a volatile memory is provided with more than 5,000 fuse elements for recovering defective memory cells. A laser trimming process for the fuse elements is readily carried out as compared with fuse elements which are electrically blown out, for example, instead of laser light, and the operation after the trimming is quite stable, as compared with transistor-based switching elements, by way of example. In addition, the laser trimming is advantageous in the elimination of an access time to a register and a resulting faster operation over the recovery method which involves a non-volatile register for holding defective address information within a volatile memory. From the foregoing, it is believed that the laser trimming will dominate the recovery of defective memory cells in an individual memory in the future as well.

The present invention not only relies on the laser trimming performed in an individual volatile memory to recover defective memory cells but also transfers defective device information, defective row address signal and defective column address signal stored in a non-volatile memory to a volatile memory through a memory control circuit contained in a system upon start-up of the system, to hold the information in defect information storage circuit 25 and device information storage circuit 26, such that defective memory cells can be recovered even after the memory module has been manufactured, thereby making it possible to improve the yield rate of the memory module while minimizing a delay in accessing the volatile memory.

While preferred embodiments of the present invention have been described using specific terms, such description is for illustrative purposes only, and it is to be understood that changes and variations may be made without departing from the spirit or scope of the following claims.

What is claimed is:

1. A memory module recovery method for use with a memory module which comprises a volatile memory and a non-volatile memory for recovering said volatile memory when determined as defective in an electric test, said method comprising the steps of:

previously storing a defective row address and a defective column address corresponding to a memory cell of said volatile memory determined as defective, and defective device information for discriminating said volatile memory determined as defective in said non-volatile memory;

transferring said defective row address, said defective column address and said defective device information stored in said non-volatile memory to said volatile memory upon start-up of a system which is equipped with said memory module;

holding said transferred defective row address, defective column address and defective device information in said volatile memory; and accessing a redundant memory cell instead of said memory cell determined as defective when said memory module receives an address corresponding to said memory cell based on said defective row address, said defective column address and said defective device information held in said volatile memory.

2. A memory module recovery method for use with a memory module which comprises a volatile memory and a non-volatile memory for recovering said volatile memory when determined as defective in an electric test, said method comprising the steps of:

previously storing a defective row address and a defective column address corresponding to a memory cell of said volatile memory determined as defective, and defective device information for discriminating said volatile memory determined as defective in said non-volatile memory;

transferring said defective row address, said defective column address and said defective device information stored in said non-volatile memory to said volatile memory upon start-up of a system which is equipped with said memory module;

holding said transferred defective row address, defective column address and defective device information in said volatile memory; and accessing a redundant memory cell instead of said memory cell determined as defective when said memory module receives an address corresponding to said memory cell based on said defective row address, said defective column address and said defective device information held in said volatile memory, wherein said volatile memory comprises a plurality of fuse elements which can be blown out by laser light, said fuse elements being capable of holding information required to access said redundant memory cell instead of a memory cell determined as defective in a test at the end of a wafer manufacturing process.

3. A memory module comprising:

a volatile memory for holding a defective row address, a defective column address and a defective device information transferred thereto upon start-up of a system, said volatile memory including a redundant memory cell which is accessed instead of a memory cell determined as defective in said volatile memory when said memory module receives an address signal corresponding to said memory cell determined as defective; and a non-volatile memory for storing said defective row address and said defective column address corresponding to said memory cell in a volatile memory which is determined as defective in an electric test.

4. A memory module comprising:

a volatile memory for holding a defective row address, a defective column address and a defective device information transferred thereto upon start-up of a system, said volatile memory including a redundant memory cell which is accessed instead of a memory cell determined as defective in said volatile memory when said memory module receives an address signal corresponding to said memory cell determined as defective; and a non-volatile memory for storing said defective row address and said defective column address corresponding to said memory cell in a volatile memory which is determined as defective in an electric test, wherein said volatile memory comprises a plurality of fuse elements which can be blown out by laser light, said fuse elements being capable of holding information required to access said redundant memory cell instead of a memory cell determined as defective in a test at the end of a wafer manufacturing process.

5. A volatile memory having a redundant memory cell which is accessed instead of a defective memory cell in which a defect is found, said volatile memory comprising:

a defect information storage circuit for holding a defective row address and a defective column address transferred from the outside;

a device information storage circuit for determining whether or not said defective device information relates to said volatile memory itself to hold the result of the determination;

a row address comparator for comparing the defective row address stored in said defective information storage circuit with a row address supplied from the outside;

a column address comparator for comparing the defective column address stored in said defective information storage circuit with a column address supplied from the outside;

a redundant row decoder for activating a word line connected to said redundant memory cell when said defective row address matches said row address to enable an access to said redundant memory cell; and a redundant column decoder for activating a bit line connected to said redundant memory cell when said defective column address matches said column address to enable an access to said redundant memory cell.

6. A volatile memory having a redundant memory cell which is accessed instead of a defective memory cell in which a defect is found, said volatile memory comprising:

a defect information storage circuit for holding a defective row address and a defective column address transferred from the outside;

a device information storage circuit for determining whether or not said defective device information relates to said volatile memory itself to hold the result of the determination;

a row address comparator for comparing the defective row address stored in said defective information storage circuit with a row address supplied from the outside;

a column address comparator for comparing the defective column address stored in said defective information storage circuit with a column address supplied from the outside;

a redundant row decoder for activating a word line connected to said redundant memory cell when said defective row address matches said row address to enable an access to said redundant memory cell; and a redundant column decoder for activating a bit line connected to said redundant memory cell when said defective column address matches said column address to enable an access to said redundant memory cell, wherein said redundant row decoder and said redundant column decoder each include a plurality of fuse elements which can be blown out by laser light for holding information required to access said redundant memory cell instead of a memory cell which is determined as defective in a test at the end of a wafer manufacturing process.

* * * * *